(12) United States Patent
Sivonen et al.

(10) Patent No.: US 7,774,019 B2
(45) Date of Patent: Aug. 10, 2010

(54) RF INPUT TRANSCONDUCTOR STAGE

(75) Inventors: Pete Sivonen, Helsinki (FI); Ari Vilander, Kerava (FI)

(73) Assignee: Nokia Corporation, Espoo (FI)

( * ) Notice: Subject to any disclaimer, the term of this patent is extended or adjusted under 35 U.S.C. 154(b) by 526 days.

(21) Appl. No.: 11/826,779

(22) Filed: Jul. 18, 2007

(65) Prior Publication Data

US 2008/0261553 A1 Oct. 23, 2008

(30) Foreign Application Priority Data

Apr. 19, 2007 (FI) .................................. 20075275

(51) Int. Cl.
*H04M 1/00* (2006.01)

(52) U.S. Cl. .................... 455/552.1; 455/333; 330/285; 327/359

(58) Field of Classification Search ................. 455/333, 455/334, 552.1; 330/285; 327/359
See application file for complete search history.

(56) References Cited

U.S. PATENT DOCUMENTS

| | | | | |
|---|---|---|---|---|
| 6,057,714 | A * | 5/2000 | Andrys et al. ............... | 327/105 |
| 6,380,777 | B1 * | 4/2002 | Degardin et al. ............ | 327/170 |
| 6,396,330 | B1 * | 5/2002 | Fujii ......................... | 327/355 |
| 6,529,721 | B1 * | 3/2003 | Tiller ......................... | 455/323 |
| 6,611,680 | B2 * | 8/2003 | Litwin et al. ............... | 455/311 |
| 6,807,407 | B2 * | 10/2004 | Ji .............................. | 455/326 |
| 2005/0143044 | A1 | 6/2005 | Kim | |
| 2005/0174167 | A1 | 8/2005 | Vilander et al. | |
| 2007/0066269 | A1 | 3/2007 | Kivekas et al. | |

FOREIGN PATENT DOCUMENTS

| WO | WO 99/50966 | 10/1999 |
|---|---|---|
| WO | WO 00/19653 | 4/2000 |

OTHER PUBLICATIONS

R. Gharpurey, N. Yanduru, F. Dantoni, P. Litmanen, G. Sirna, T. Mayhugh, C. Lin, I. Deng, P. Fontaine, and F. Lin, "A Direct-Conversion Receiver for the 3G WCDMA Standard," IEEE J. Solid-State Circuits, vol. 38, pp. 556-560, Mar. 2003.

S. K. Reynolds, B. A. Floyd, T. Beukema, T. Zwick, U. Pfeiffer, and H. Ainspan, "A Direct-Conversion Receiver IC for WCDMA Mobile Systems," IEEE J. Solid-State Circuits, vol. 38, pp. 1555-1560, Sep. 2003.

(Continued)

*Primary Examiner*—Nhan Le
(74) *Attorney, Agent, or Firm*—Squire, Sanders & Dempsey L.L.P.

(57) ABSTRACT

A transconductor input circuit for a down converting quadrature mixer stage of a direct-conversion receiver comprises a pair of common-gate input transistors whose source electrodes are coupled to a differential radio frequency (RF) input signal outputted from an interstage RF filter. The transconductor circuit further comprises a pair of equally-sized biasing transistors for biasing the pair of common-gate input transistors. Source electrodes of the biasing transistors are coupled to the source electrodes of the transistors to sense the differential radio frequency input signal for canceling intermodulation distortion.

9 Claims, 6 Drawing Sheets

OTHER PUBLICATIONS

M. Hafizi, S. Feng, T. Fu, K. Schulze, R. Ruth, R. Schwab, P. Karlsen, D. Simmonds, and G. Qizheng, "RF Front-End of Direct Conversion Receiver RFIC for CDMA-2000," IEEE J. Solid-State Circuits, vol. 39, pp. 1622-1632, Oct. 2004.

M. A. Dubois, J. F. Carpentier, P. Vincent, C. Billard, G. Parat, C. Muller, P. Ancey, and P. Conti, "Monolithic Above-IC Resonator Technology for Integrated Architectures in Mobile and Wireless Communication," IEEE J. Solid-State Circuits, vol. 41, pp. 7-16, Jan. 2006.

D. Kaczman, M. Shah, N. Godambe, M. Alam, H. Guimaraes, L. M. Han, M. Rachedine, D. L. Cashen, W. E. Gatka, C. Dozier, W. P. Shepherd, and K. Couglar, "A Single-Chip Tri-Band (2100, 1900, 850/800 MHz) WCDMA/HSDPA Cellular Transceiver," IEEE J. Solid-State Circuits, vol. 41, pp. 1122-1132, May 2006.

M. Brandolini, P. Rossi, D. Sanzogni, and F. Svelto, "A +78 dBm IIP2 CMOS Direct Downconversion Mixer for Fully Integrated UMTS Receivers," IEEE J. Solid-State Circuits, vol. 41, pp. 552-559, Mar. 2006.

V. Aparin, N. Kim, G. Brown, Y. Wu, A. Cicalini, S. Kwok, and C. Persico, "A Fully-Integrated Highly Linear Zero-IF CMOS Cellular CDMA Receiver," in IEEE ISSCC Dig. Tech. Papers, San Francisco, CA, 2005, pp. 324-326.

K. Kivekäs, A. Pärssinen, and K. A. I. Halonen, "Characterization of IIP2 and DC-Offsets in Transconductance Mixers," IEEE Trans. Circuits Syst. II, vol. 48, pp. 1028-1038, Nov. 2001.

A. Rofougaran, J. Y. C. Chang, M. Rofougaran, and A. A. Abidi, "A 1 GHz CMOS RF Front-End IC for a Direct-Conversion Wireless Receiver," IEEE J. Solid-State Circuits, vol. 31, pp. 880-889, Jul. 1996.

P. Sivonen, A. Vilander, and A. Pärssinen, "Cancellation of Second-Order Intermodulation Distortion and Enhancement of IIP2 in Common-Source and Common-Emitter RF Transconductors," IEEE Trans. Circuits Syst.-I: Regular Papers, vol. 52, pp. 305-317, Feb. 2005.

International Search Report PCT/FI2008/050194 dated Aug. 13, 2008.

* cited by examiner

RF INPUT TRANSCONDUCTOR STAGE

FIELD OF THE INVENTION

This invention relates generally to radio frequency (RF) input transconductor stages and, more particularly, to RF input transconductor stages for direct-conversion receivers, wherein a received RF signal is downconverted directly to baseband without generating one or more intermediate frequencies (IFs).

BACKGROUND OF THE INVENTION

The mobile wireless communications market has been growing very rapidly in recent years. The rapid growth has been aided by low-power, low-cost, and high-performance radio frequency (RF) integrated circuits (ICs). Increasing the level of integration has been the major target in the design of transceivers for wireless applications. Highly integrated RFIC reduces the printed circuit board (PCB) area and complexity while lowering the component cost.

In recent years, wireless direct-conversion radio receiver architectures have gained increasing attention, because in these topologies a very high level of integration can be obtained. In a direct-conversion receiver, also known as homodyne, or zero-IF receiver, radio frequency (RF) signals are converted directly into baseband signals, whereby separate intermediate frequency stages are not required. Thus, the number of high-frequency components needed in direct-conversion receivers is lower than in conventional receivers (e.g. super-heterodyne) which include intermediate frequency stages. Due to lower complexity, the integration degree of direct-conversion receivers can be increased in comparison with receivers including intermediate-frequency stages. Moreover, radio transceivers and complete systems-on-a-chip (SOC) realized in pure CMOS (Complementary Metal Oxide Semiconductor) technology are rapidly appearing in a wireless market that for years was dominated by bipolar and BiCMOS (Bipolar Complementary Metal Oxide Semiconductor) implementations.

Figure 1:
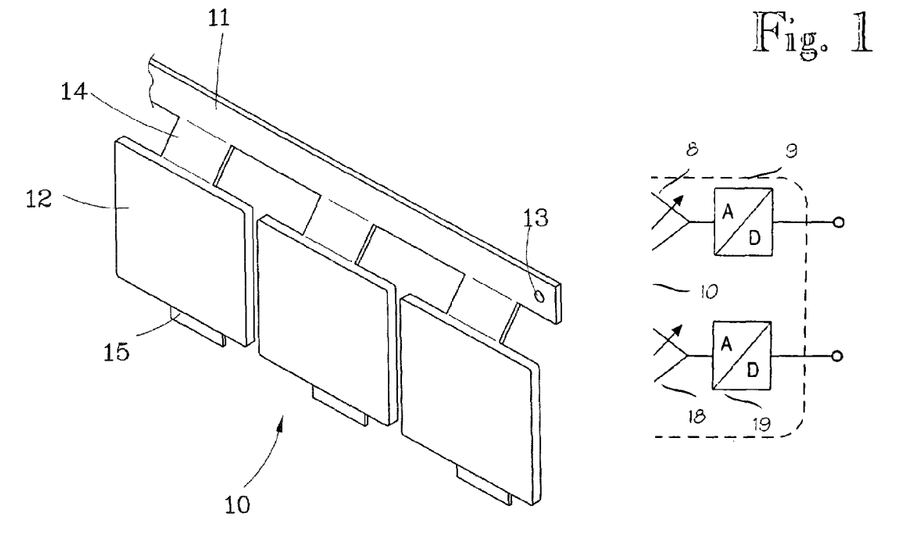
FIG. 1 is an exemplary block diagram of direct-conversion receiver architecture.

A schematic block diagram of a direct conversion receiver is shown in FIG. 1. An antenna 2 feeds a received RF signal to a bandpass filter (duplexer) 3 that performs a preselection of a received RF band. A low-noise amplifier (LNA) 5, which is usually the first integrated block of a receiver RFIC 1, amplifies the RF signal in order to reduce the noise contributions of the following stages. Quadrature down conversion mixers 6 and 16 are provided to mix a received signal against an in-phase (I) local oscillator signal and a quadrature (Q) local oscillator signal (via a 90-degree phase shifter 11) from a local oscillator 10 tuned to the center frequency of the desired radio channel. The down-converting mixer 6 outputs the baseband I signal and high-frequency mixing products. Similarly, the down-converting mixer 16 outputs the baseband Q signal and high-frequency mixing products. Low-pass filtering 7 and 17 following down-converter mixers 6 and 16, respectively, removes the high-frequency mix product and any interference signals near the received channel. The filtered baseband I and Q signals are then independently amplified by variable gain amplifiers (VGAs) 8 and 18, respectively, and converted into a digital representation with analog-to-digital (A/D) converters 9 and 19, respectively.

One of the most difficult problems in direct-conversion receiver architecture is the envelope distortion due to even-order nonlinearity. In a direct-conversion receiver, the second-order intermodulation introduces undesirable spectral components at the baseband, which degrade the receiver sensitivity. For instance, if two strong interferers at frequencies f1 and f2 close to the channel of interest experience even-order distortion, they generate a low-frequency interference signal at the frequency f1-f2. Accordingly, many cellular systems require very high IIP2 performance if a direct conversion is to be used.

In a well-designed receiver, the most dominant source of IM2 distortion is the down conversion mixer. Usually the down conversion mixers are based on double-balanced topologies, which generate a small amount of even-order distortion. Moreover, in an ideal mixer, the low-frequency beat present or generated at the mixer RF input is upconverted. Unfortunately, in reality, mixers present a finite feedthrough from the RF input to the intermediate-frequency (IF) output, which results in a finite IIP2. Most of the double-balanced mixers utilized in wireless receivers are realized as active mixers. In an active quadrature down conversion mixer, the RF input transconductance stage may be used to convert the differential voltage-mode RF signal to a differential RF current. In general, both the RF input transconductor and switching devices in a mixer contribute to the mixer nonlinearity, and the mixer IIP2 is determined by the mixer second-order nonlinearity, mismatches, and offsets. In a perfectly balanced mixer, stimulated and sensed differentially, the IM2 components at the mixer output are presented as common-mode signals with equal amplitude and are therefore cancelled. Unfortunately, in the presence of offsets and mismatches, the cancellation is not perfect, which results in a finite mixer IIP2. In conclusion, in order to maximize the mixer IIP2, it is essential to develop techniques for minimizing the IM2 products generated in the mixer, since the device matching and offsets cannot be improved beyond certain limits. In practice, the level of the common-mode IM2 components in the output current of the RF transconductor should be minimized or eliminated. Simultaneously, the matching requirement for the mixer output resistances can be lowered and the need for mixer IIP2 calibration or trimming can be reduced or even avoided. See documents [8] and [9], for example. Document [10] and U.S. Pat. No. 6,992,519 disclose a biasing circuit technique for canceling IM2 distortion in balanced common-source and common-emitter transconductors.

In direct-conversion receivers for full-duplex radio systems, an interstage RF filter 4 between the LNA 5 and mixer stage 6, 16 is often employed to attenuate out-of-band blockers and to suppress the signal leaking from the transmitter. The interstage RF filter 4, often realized in surface acoustic (SAW) technology, relaxes the linearity requirements set on the down-conversion mixer. Examples of direct-conversion receivers with an interstage RF filter are disclosed in documents [1] to [7]. As the down conversion mixers 6, 16 are preceded by an off-chip RF filter 4, the RF input impedance of the mixers has to be designed to match the characteristic impedance, for example, 50Ω, of the filter. If the terminating impedances of the RF filter 4 differ from the specified characteristic impedance, this may result in a large ripple in the passband and a poorer transition band of the filter. A simple and robust way of realizing the input impedance matching in a down-conversion mixer by employing a common-gate (or base) stage for the RF input transconductor in the mixer is disclosed in document [7] and shown in FIG. 2. The transconductance stage 20 may be formed by transistors M1 and M2 in a common-gate configuration so that a diffential RF input voltage is applied to the source electrodes of M1 and M2. The current-mode RF signal from the drains of M1 and M2 is then fed through the current-steering switching transistors M3 to M10 driven by the I and Q phases of the local oscillator (LO)

signal. The downconverted output signal is also produced in a current-mode and converted to the voltage at the load resistors RL. Inductors L1 and L2 are biasing inductors. The prior art circuit is further provided with a matching network formed of external matching inductors and capacitors (not shown in FIG. 2) in the RF input of the transconductance stage 20 so as to provide a differential 100-ohm matching to the external SAW filter. Moreover, to further improve IIP2, a calibration circuit is implemented. The DC offset which can degrade system performance in a zero-IF receiver circuit is controlled by a current-steering DAC at the mixer.

REFERENCES

[1] R. Gharpurey, N. Yanduru, F. Dantoni, P. Litmanen, G. Sirna, T. Mayhugh, C. Lin, I. Deng, P. Fontaine, and F. Lin, "A direct-conversion receiver for the 3G WCDMA standard," IEEE J. Solid-State Circuits, vol. 38, pp. 556-560, March 2003.

[2] S. K. Reynolds, B. A. Floyd, T. Beukema, T. Zwick, U. Pfeiffer, and H. Ainspan, "A direct-conversion receiver IC for WCDMA mobile systems," IEEE J. Solid-State Circuits, vol. 38, pp. 1555-1560, September 2003.

[3] M. Hafizi, S. Feng, T. Fu, K. Schulze, R. Ruth, R. Schwab, P. Karlsen, D. Simmonds, and G. Qizheng, "RF front-end of direct conversion receiver RFIC for CDMA-2000," IEEE J. Solid-State Circuits, vol. 39, pp. 1622-1632, October 2004.

[4] M. A. Dubois, J. F. Carpentier, P. Vincent, C. Billard, G. Parat, C. Muller, P. Ancey, and P. Conti, "Monolithic above-IC resonator technology for integrated architectures in mobile and wireless communication," IEEE J. Solid-State Circuits, vol. 41, pp. 7-16, January 2006.

[5] D. Kaczman, M. Shah, N. Godambe, M. Alam, H. Guimaraes, L. M. Han, M. Rachedine, D. L. Cashen, W. E. Gatka, C. Dozier, W. P. Shepherd, and K. Couglar, "A single-chip tri-band (2100, 1900, 850/800 MHz) WCDMA/HSDPA cellular transceiver," IEEE J. Solid-State Circuits, vol. 41, pp. 1122-1132, May 2006.

[6] M. Brandolini, P. Rossi, D. Sanzogni, and F. Svelto, "A +78 dBm IIP2 CMOS direct conversion mixer for fully integrated UMTS receivers," IEEE J. Solid-State Circuits, vol. 41, pp. 552-559, March 2006.

[7] V. Aparin, N. Kim, G. Brown, Y. Wu, A. Cicalini, S. Kwok, and C. Persico, "A fully-integrated highly linear zero-IF CMOS cellular CDMA receiver," in IEEE ISSCC Dig. Tech. Papers, San Francisco, Calif., 2005, pp. 324-326.

[8] K. Kivekäs, A. Pärssinen, and K. A. I. Halonen, "Characterization of IIP2 and DC-offsets in transconductance mixers," IEEE Trans. Circuits Syst. II, vol. 48, pp. 1028-1038, November 2001.

[9] A. Rofougaran, J. Y. C. Chang, M. Rofougaran, and A. A. Abidi, "A 1 GHz CMOS RF front-end IC for a direct-conversion wireless receiver," IEEE J. Solid-State Circuits, vol. 31, pp. 880-889, July 1996.

[10] P. Sivonen, A. Vilander, and A. Päcrssinen, "Cancellation of second-order intermodulation distortion and enhancement of IIP2 in common-source and common-emitter RF transconductors," IEEE Trans. Circuits Syst.-I: Regular Papers, vol. 52, pp. 305-317, February 2005.

SUMMARY OF THE INVENTION

An object of the present invention is to provide an improved transconductor circuit. The object is achieved by transconductor circuits, integrated circuits and direct-conversion receivers according to the attached independent claims. The preferred embodiments of the invention are disclosed in the dependent claims.

According to an aspect of the invention, a transconductor circuit comprises a first input transistor device and a second input transistor device, each of the first and second input transistor devices being arranged in a common-gate configuration with interconnected gate electrodes and having a source electrode coupled to a differential radio frequency input signal; a first biasing transistor device having a gate electrode coupled to a gate electrode of the first input transistor device; and a second equally-sized biasing transistor device having a gate electrode coupled to a gate electrode of the second input transistor device to provide biasing for the first input transistor device and the second input transistor device, respectively; the first and second biasing transistor devices each having a source electrode coupled to the source electrodes of the first input transistor device and the second input transistor device, respectively, to sense the differential radio frequency input signal. The transistor devices may be field effect transistors.

According to another aspect of the invention, a transconductor circuit comprises a first input transistor device and a second input transistor device, each of the first and second input transistor devices being arranged in a common-base configuration with interconnected base electrodes and having an emitter electrode coupled to a differential radio frequency input signal; a first biasing transistor device having a base electrode coupled to a base electrode of the first input transistor device, a second equally-sized biasing transistor device having a base electrode coupled to a base electrode of the second input transistor device, and a third biasing transistor device having a base electrode coupled to collector electrodes of the first and second bias transistor devices and an emitter electrode coupled to the base electrodes of the first input transistor device and the second input transistor device; the first and second biasing transistor devices each having an emitter electrode operationally coupled to the emitter electrodes of the first input transistor device and the second input transistor device, respectively, to sense the differential radio frequency input signal.

A further aspect of the invention is an integrated circuit comprising a down-converting quadrature mixer stage and a transconductor input stage according to any embodiment of the present invention.

A still further aspect of the invention is a direct-conversion receiver comprising an integrated circuit containing a low-noise RF amplifier, a transconductor input stage according to any embodiment of the present invention, and a down-converting quadrature mixer stage, as well as an external inter-stage RF filter connected between the low-noise amplifier and the transconductor input stage.

The low-frequency IM2 distortion is sensed and compensated and the IIP2 is enhanced in a common-gate and common-base RF transconductor. A transconductor circuit according to embodiments of the invention may be utilized as an RF input transconductor in double-balanced down conversion mixers. A transconductor circuit according to embodiments of the invention may be realized with and without degeneration. A transconductor circuit according to embodiments of the invention is very suitable for operating at a low supply voltage because it has only one device stacked between the transconductor input and output. The low-voltage operation is especially important when integration of an RF transceiver on pure digital CMOS technology is considered. This alleviates the implementation of a single-chip radio, which targets for lowest cost. Finally, by merits of a transconductor circuit according to embodiments of the invention, the need for down-conversion mixer IIP2 calibration or trimming can be reduced or even avoided. Simultaneously, the yield of the entire radio receiver IC can be improved.

BRIEF DESCRIPTION OF THE DRAWINGS

In the following the invention will be described in greater detail by means of preferred embodiments with reference to the attached drawings, in which.

DESCRIPTION OF EXAMPLE EMBODIMENTS OF THE INVENTION

The present invention will now be illustrated and described with exemplary embodiments by using common-gate CMOS RF transconductor and common-base bipolar RF transconductor stages. To facilitate the understanding of the present invention, conventional types of common-gate CMOS transconductor and common-base bibolar RF transconductor stages are also briefly discussed and analysed, which further enables comparative simulations between the embodiments of the present invention and the conventional circuit.

A Conventional Common-Gate Circuit RF Transconductor

Figure 2:
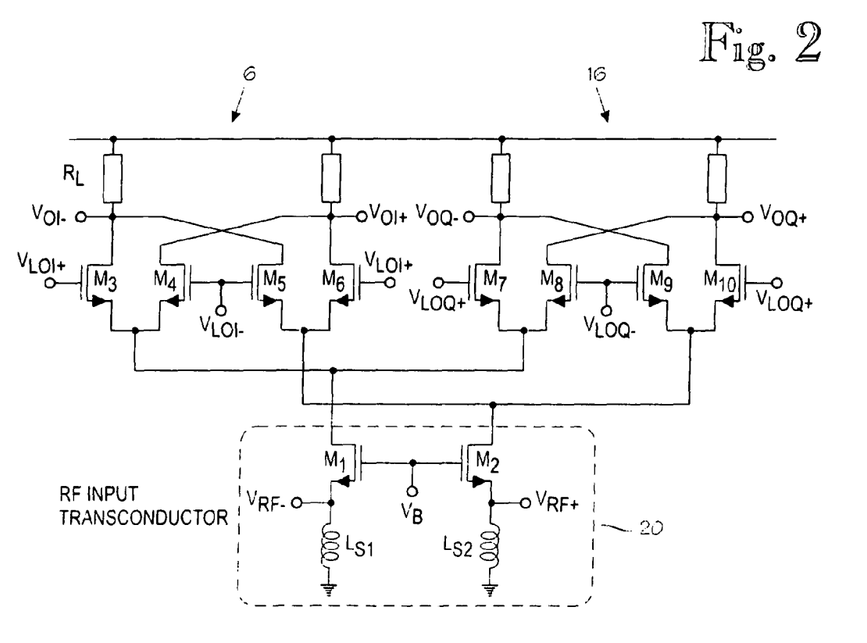
FIG. 2 is a schematic diagram of a quadrature down-conversion mixer having a single common-gate RF input transconductor for both I and Q mixers.
Figure 3:
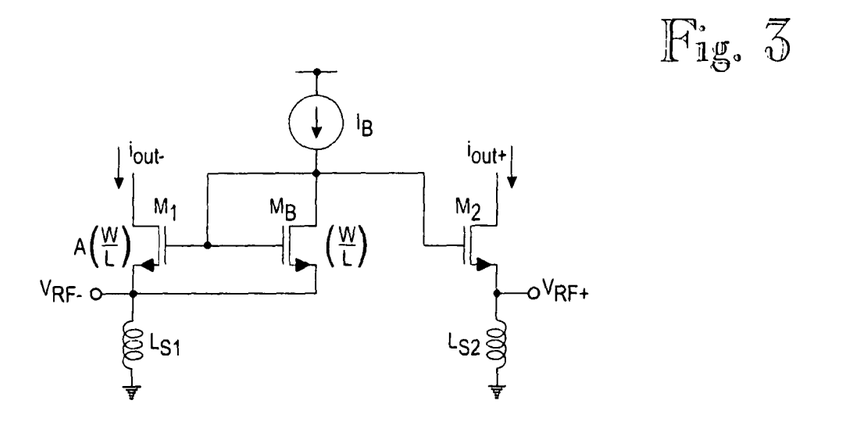
FIG. 3 is a schematic diagram of a conventional common-gate RF transconductor.

To facilitate the understanding of an embodiment of the present invention, FIG. 3 illustrates the schematics of the conventional balanced common-gate RF input transconductor, such as the transconductor stage 20 in FIG. 2. The common-gate stage is biased by a current source $I_B$ and a field effect transistor (FET) $M_B$. Since the current mirror ratio of the main field effect transistors $M_1$, $M_2$ and the bias transistor MB is A, the drain-source current ($I_{DS}$) of $M_1$ and $M_2$ is ideally $A \cdot I_B$. The inductors $L_{S1}$ and $L_{S2}$ at the source electrodes of $M_1$ and $M_2$ tune out any parasitic capacitances present at the RF inputs $V_{RF-}$ and $V_{RF+}$. Nevertheless, the inductors $L_{S1}$ and $L_{S2}$ are not necessarily always required and they may be replaced with current sources or resistors, for instance.

Assuming that the inductors $L_{S1}$-$L_{S2}$ tune out parasitic capacitances presented at the inputs $V_{RF-}$ and $V_{RF+}$, the (single-ended) input impedance of the common-gate circuit can be approximated as $$Z_{in} = \frac{1}{g_{m1}} \quad (1)$$

where gm1 is the transconductance of the common-gate field-effect transistor (FET) M1, or M2. In addition, the input impedance matching requires that $$Z_{in} = R_s = \frac{1}{g_{m1}} \quad (2)$$

where Rs is the generator resistance (i.e. usually 50Ω).

Let us assume that the RF input signal of the common-gate transconductor consists of two closely spaced RF signals, such as $v_{RF+(t)} = -v_{RF-(t)} = 0.5 \cdot v_{RF} \cdot (\cos(\omega RF1 t) + \cos(\omega RF2 t))$, where $v_{RF}$ is the differential RF input amplitude. Then, it can be shown that the single-ended output current $i_{OUT+}$, or $i_{OUT-}$, of the common-gate RF transconductor includes a common-mode IM2 component at the low frequency of $f_1$-$f_2$. In a perfectly balanced mixer, this component is cancelled in the mixer's differential output. However, in the presence of mismatches, the cancellation is not perfect. Therefore, in the sense of the entire mixer IIP2, the presence of the IM2 component in the single-ended output current is a clear drawback of the common-gate RF transconductor.

If the IDS of the MOS transistors $M_1$ and $M_2$ are modeled by $$I_{DS} = \frac{K}{2} \frac{AW}{L} \frac{V_{eff}^2}{(1 + \theta V_{eff})} \quad (3)$$

where $V_{eff} = V_{GS} - V_T$ and $V_{GS}$ is the gate-source voltage, it can be shown that the IIP2 of the common-gate circuit, measured at the single-ended transconductor output $i_{OUT+}$ (or $i_{OUT-}$), is given by $$v_{IIP2} = 2 V_{eff} (1 + \theta V_{eff})(2 + \theta V_{eff}) \approx 4 V_{eff} \quad (4)$$

which represents the differential RF input amplitude.

Similarly, it can be shown that the third-order intercept point (IIP3) of the conventional common-gate circuit shown in FIG. 3(a) is given by $$v_{IIP3} = 4\sqrt{\frac{2}{3}} \sqrt{\frac{(2 + \theta V_{eff}) V_{eff}}{\theta}} (1 + \theta V_{eff}) \approx \frac{8}{\sqrt{3}} \sqrt{\frac{V_{eff}}{\theta}} \quad (5)$$

In Equations (4) to (5), the approximations hold if $\theta V_{eff} \ll 1$.

Equations (1) to (5) provide insight and guidelines for the design of a common-gate RF input transconductor. First, the target IIP3, given by Equation (5), determines the RF input transconductor Veff. Next, as can be seen from Equation (2), the input impedance matching requirement defines the RF input stage gm given by $$g_m = \frac{K}{2} \frac{AW}{L} \frac{(2+\theta V_{eff}^2) V_{eff}}{(1+\theta V_{eff})^2} \quad (6)$$

and thus also the AW/L aspect ratio of the input transistors. Accordingly, the target values for the IIP3 and input impedance together determine the mixer current consumption [see Eq. (3)].

Figure 4:
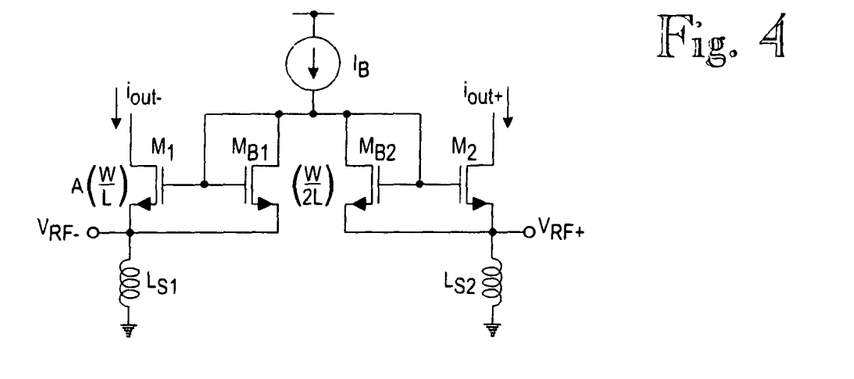
FIG. 4 is a schematic diagram of a common-gate RF transconductor according to an exemplary embodiment of the invention.

A Common-Gate RF Transconductor According to an Exemplary Embodiment of the Invention A common-gate RF transconductor stage according to an exemplary embodiment of the invention is illustrated in FIG. 4. The transconductor stage comprises the main field effect transistors (FETs) $M_1$ and $M_2$ in a common-gate configuration. The transistors $M_1$ and $M_2$ may be MOS (metal-oxide-semiconductor) FETs. The source electrode of $M_1$ is connected via a biasing inductor $L_{S1}$ to a reference potential, such as ground. Similarly, the source electrode of $M_2$ is connected via a biasing inductor $L_{S2}$ to the reference potential, such as ground. However, inductors LS1 and LS2 are not necessarily always required and they may be replaced, for instance, with current sources or resistors. Input terminals for a differential RF input voltage $V_{RF-}$ and $V_{RF+}$ are provided at source electrodes of M1 and M2, respectively. The main transistors M1 and M2 are biased by a current source $I_B$ and field effect transistors (FETs) $M_{B1}$ and $M_{B2}$. Transistors $M_{B1}$ and $M_{B2}$ may be MOSFETs, they are of equal size, and they may be half the size (W/2 L) of the single transistor (W/L) in the conventional stage shown in FIG. 3. The current source $I_B$ is connected to the drain electrodes of $M_{B1}$ and $M_{B2}$. The gate electrode of $M_{B1}$ is connected to the gate electrode of $M_1$ and to the drain electrode of $M_{B1}$. Similarly, the gate electrode of $M_{B2}$ is connected to the gate electrode of $M_2$ and to the drain electrode of $M_{B2}$. More specifically, the gate electrodes of all transistors $M_1$, $M_2$, $M_{B1}$ and $M_{B2}$ are interconnected. Moreover, the source electrode of $M_{B1}$ is connected to the source electrode of $M_1$, and the source electrode of $M_{B2}$ is connected to the source electrode of $M_2$. This way, the differential RF input signal is also applied to the biasing FETs $M_{B1}$ and $M_{B2}$. Thus, the biasing circuit senses the low-frequency IM2 products in the bias of two common-gate stages and compensates the intermodulation distortion. As a matter of fact, if the $I_{DS}$ of a MOS transistor is modeled by Equation (3), it can be shown that the single-ended output current $i_{OUT+}$ (or $i_{OUT-}$) of the RF input transconductor according to the embodiment does not display any IM2 components. Thus, the corresponding IIP2 of the common-gate circuit, measured at the single-ended transconductor output, is ideally infinite. Naturally, this is a significant improvement on the conventional common-gate RF transconductor with respect to the IIP2 of the mixer and entire radio receiver.

Again, assuming that the inductors $L_{S1}$-$L_{S2}$ tune out parasitic capacitances presented at the RF input, the (single-ended) input impedance of the common-gate circuit of FIG. 4 can be approximated as $$Z_{in} = \frac{1}{g_{m1} + g_{mB1}} \quad (7)$$

where $g_{mB1}$ is the transconductance of the biasing FET $M_{B1}$ ($M_{B2}$). Since $M_1$ and $M_{B1}$ are biased at the same $V_{GS}$ and $W_1=W_2=2AW_{B1}=2AW_{B2}$, $g_{m1}=g_{m2}=2Ag_{mB1}=2Ag_{mB2}$. In addition, since the current mirror ratios (A) of 5 or larger are typical (or 2 A$\gg$1)

$$Z_{in} = \frac{1}{g_{m1} + g_{mB1}} = \frac{2A}{g_{m1}(2A+1)} \approx \frac{1}{g_{m1}} \quad (8)$$

As a result, for given FET dimensions AW/L and current $I_{DS}$, both the conventional common-gate transconductor of FIG. 3 and the novel common-gate transconductor of FIG. 4 provide equal RF input transconductance for the down conversion mixer.

If the $I_{DS}$ of the MOS transistor is modeled by Equation (3), it can be shown that the IIP3 of the proposed common-gate circuit shown in FIG. 4 is given by $$v_{IIP3} = 4\sqrt{\frac{2}{3} \frac{(2+\theta V_{eff})(1+\theta V_{eff}) V_{eff}}{\sqrt{2+(2+\theta V_{eff})\theta V_{eff}}}} \approx \frac{8}{\sqrt{3}} V_{eff} \quad (9)$$

By comparing Equations (5) and (9) it is seen that the common-gate circuit of FIG. 4 has by a factor of $1/\sqrt{\theta V_{eff}}$ a smaller IIP3 in comparison with the IIP3 of the traditional common-gate stage.

It can be shown that at impedance match the noise factor of the common-gate circuit of FIG. 4 can be approximated as $$F = 1 + \frac{2(A+1)^2 \gamma}{A(2A+1)} + \frac{\gamma}{(2A+1)} \approx 1 + \gamma + \frac{\gamma}{2A} \approx 1 + \gamma \quad (10)$$

where the first and second terms are due to the channel thermal noise in the main ($M_1$) and bias ($M_{B1}$) FETs, respectively. On the other hand, the noise factor of the conventional common-gate circuit at impedance match is (1+γ). Thus, the circuit of FIG. 4 has a larger noise factor due to the noise in the bias FET. However, if a sufficiently large current mirror ratio (A) is used (A$\gg$1) and thus the current in the biasing FET $M_{B1}/M_{B2}$ is scaled down, the noise contribution of the bias FET can be minimized. As a result, the common-gate circuit of FIG. 4 and the traditional approach have almost the same noise factor, as shown by Equation (10).

Conventional Balanced Common-Base RF Input Transconductor

Figure 5:
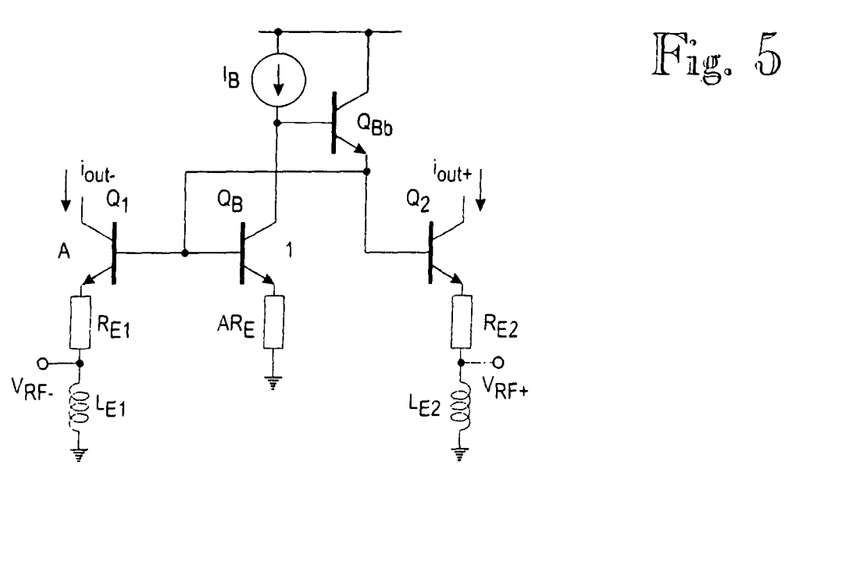
FIG. 5 is a schematic diagram of a conventional common-base RF transconductor.

FIG. 5 illustrates the schematics of a conventional balanced common-base RF input transconductor with resistive degeneration. Resistive degeneration is considered, since typically the bipolar RF transconductors are linearized by degeneration, unlike CMOS RF transconductors. Usually CMOS devices utilized in the mixer RF input transconductors are linearized simply by increasing their gate-source overdrive voltage $V_{eff}$, as also illustrated by Equations (5) and (9). The common-base stage $Q_1, Q_2$ shown in FIG. 5 is biased by the current source $I_B$ and a transistor $Q_B$. Since the current mirror ratio of the main transistors $Q_1$-$Q_2$ and the bias transistor $Q_B$ is A, the collector current ($I_C$) of $Q_1$ and $Q_2$ is ideally $A \cdot I_B$. A further bias transistor $Q_{Bb}$ provides base currents for the main bias transistor $Q_B$ and the main RF transistors $Q_1$ and $Q_2$. The inductors $L_{E1}$-$L_{E2}$ at the emitters of $Q_1$ and $Q_2$ tune out any parasitic capacitances present at the RF input. However, these inductors are not necessarily always required and they can be replaced for instance with current sources or resistors.

Assuming that the inductors $L_{E1}$-$L_{E2}$ tune out parasitic capacitances presented at the RF input, the (single-ended) input impedance of the common-base circuit can be approximated as $$Z_{in} = \frac{1}{g_{m1}} + R_E \quad (11)$$

where $g_{m1}$ is the transconductance of the common-base bipolar junction transistor (BJT) $Q_1$ ($Q_2$). In addition, the input impedance matching requires that $$Z_{in} = R_s = \frac{1}{g_{m1}} + R_E \quad (12)$$

where $R_s$ is the generator resistance (i.e. usually 50Ω).

Let us assume again that the RF input signal of the common-base transconductor consists of two closely spaced RF signals as $V_{RF+}(t) = -V_{RF-}(t) = 0.5 \cdot v_{RF} \cdot (\cos(\omega_{RF1}t) + \cos(\omega_{RF2}t))$, where $V_{RF}$ is the differential RF input amplitude. Then, it can be shown that the single-ended output current $i_{OUT+}$ (or $i_{OUT-}$) of the common-base RF transconductor includes a common-mode IM2 component at the low frequency of $f_1$-$f_2$. In a perfectly balanced mixer, this component is cancelled in the mixer's differential output. However, in the presence of mismatches, the cancellation is not perfect. Therefore, in the sense of the entire mixer IIP2, the presence of the IM2 component in the single-ended output current is a clear drawback of the common-base RF transconductor. Let us suppose that the $I_C$ of bipolar transistors $Q_1$ is $Q_2$ is modeled by $$I_C = I_S e^{v_{BE}/v_t} \quad (13)$$

where $I_S$ is the collector saturation current and, at room temperature 29° C., $V_t = k_B T/q = 26$ mV, where q is the electron charge, $k_B$ is the Bolzmann's constant, and T is absolute temperature. Then, it can be shown that the IIP2 of the common-base circuit, measured at the single-ended transconductor output $i_{OUT+}$ (or $i_{OUT-}$), is given by $$v_{IIP2} = 4V_t(1+g_m R_E)^2 \quad (14)$$

which represents the differential RF input amplitude.

Figure 7:
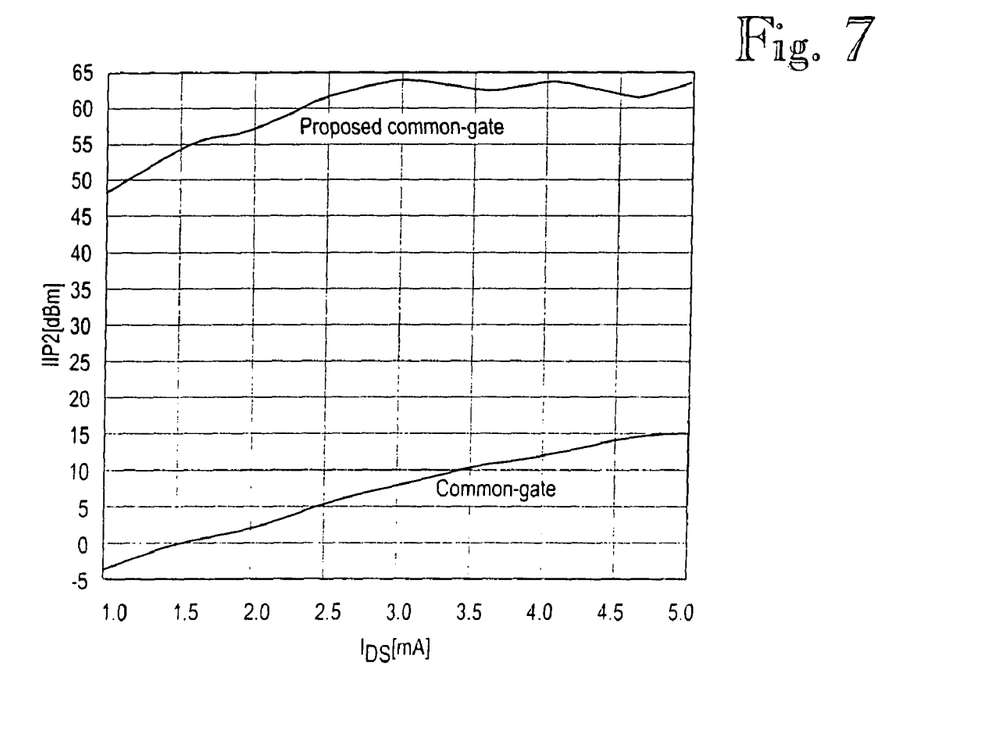
FIG. 7 is a graph illustrating the common-mode IIP2 of the conventional common-gate RF transconductor of FIG. 3 and the proposed common-gate RF transconductor of FIG. 4.

Similarly, it can be shown that the IIP3 of the conventional common-base circuit shown in FIG. 7(*a*) is given by $$v_{IIP3} = \frac{8V_t(1+g_m R_E)^2}{\sqrt{2g_m R_E - 1}} \quad (15)$$

Figure 6:
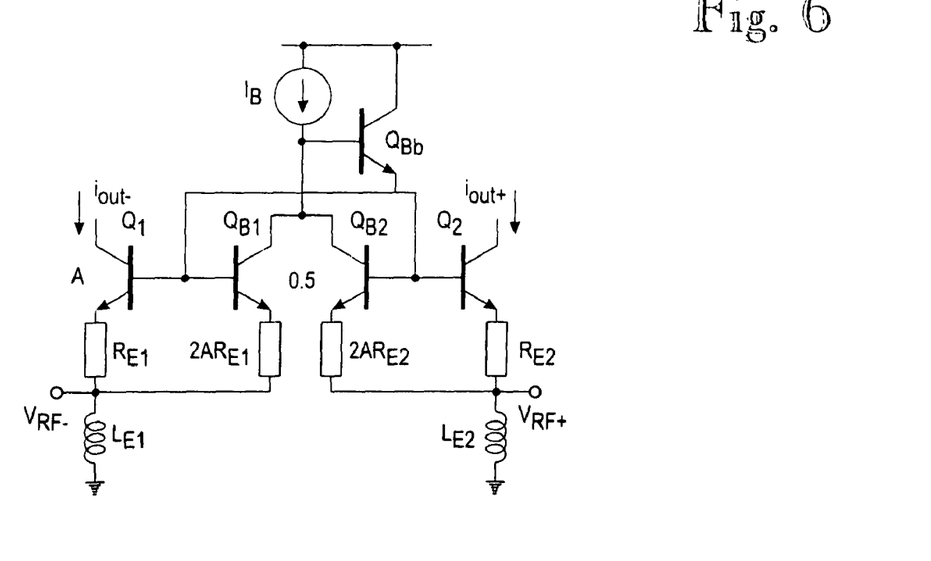
FIG. 6 is a schematic diagram of a common-base RF transconductor according to an exemplary embodiment of the invention.

A Common-Base RF Transconductor According to an Exemplary Embodiment of the Invention A common-base RF transconductor stage according to an exemplary embodiment of the invention is illustrated in FIG. 6. More specifically, FIG. 6 illustrates a bipolar realization of the circuit technique presented for MOS transistors in FIG. 4. The transconductor stage comprises the main bipolar junction transistors (BJTs) $Q_1$ and $Q_2$ in a common-base configuration. The emitter electrode of $Q_1$ is connected via an emitter resistor $R_{E1}$ and a biasing inductor $L_{E1}$ to a reference potential, such as ground. Similarly, the emitter electrode of $Q_2$ is connected via an emitter resistor $R_{E2}$ and a biasing inductor $L_{E2}$ to the reference potential, such as ground. However, inductors $L_{E1}$ and $L_{E2}$ are not necessarily always required and they may be replaced, for instance, with current sources or resistors. An input terminal for a differential RF input voltage $V_{RF-}$ is provided at a node between the emitter resistor $R_{E1}$ and the inductor $L_{E1}$, and an input terminal for a differential RF input voltage $V_{RF+}$ is provided at a node between the emitter resistor $R_{E2}$ and the inductor $L_{E2}$. The main transistors $Q_1$ and $Q_2$ are biased by a current source $I_B$ and bipolar transistors $Q_{B1}$ and $Q_{B2}$. Transistors $Q_{B1}$ and $Q_{B2}$ are of equal size, and they may be half the size of the single transistor $Q_B$ in the conventional stage shown in FIG. 5. The current source $I_B$ is connected to the collector electrodes of $Q_{B1}$ and $Q_{B2}$ and to a base electrode of a further bias transistor $Q_{Bb}$. An emitter of $Q_{Bb}$ is connected to the base electrodes of main bias transistors $Q_{B1}$ and $Q_{B2}$ as well as to the base electrodes of main RF transistors $Q_1$ and $Q_2$ to provide base currents. The base electrode of $Q_{B1}$ is connected to the base electrode of $Q_1$. Similarly, the base electrode of $Q_{B2}$ is connected to the gate electrode of $Q_2$. The base electrodes of transistors $Q_1$ and $Q_2$ are interconnected. Moreover, the emitter electrode of $Q_{B1}$ is connected to the RF input terminal $V_{RF-}$ via an emitter resistor $2AR_{E1}$, and the emitter electrode of $Q_{B2}$ is connected to the RF input terminal $V_{RF+}$ via an emitter resistor $2AR_{E2}$. The values of the emitter resistances $2AR_{E1}$ and $2AR_{E1}$ are 2 A times the emitter resistance $AR_E$ in the circuit of FIG. 5, wherein A is a current mirror ratio. This way, the differential RF input signal is also applied to the biasing transistors $Q_{B1}$ and $Q_{B2}$. Thus, the biasing circuit senses the low-frequency IM2 products in the bias of two common-base stages and compensates the intermodulation distortion. It should be appreciated that although the bipolar transconductor according to this embodiment of the invention is presented with degeneration, the sensing and compensation technique presented above also applies to a common-emitter circuit without degeneration.

The bipolar transconductor circuit shown in FIG. 6 operates in exactly the same way as its CMOS counterpart shown in FIG. 4. Thus, the bias circuit shown in FIG. 6 senses the low-frequency IM2 products in the bias of two common-base stages and compensates the intermodulation distortion. As a matter of fact, if the $I_C$ of BJT is modeled by Equation (13), it can be shown that the single-ended output current $i_{OUT+}$ (or $i_{OUT-}$) of the RF input transconductor of FIG. 6 does not exhibit any IM2 components. Thus, the corresponding IIP2 of the common-base circuit, measured at the single-ended transconductor output, is ideally infinite. Naturally, this is a significant improvement on the conventional common-base RF transconductor with respect to the IIP2 of the mixer and entire radio receiver.

Again, assuming that the inductors $L_{E1}$-$L_{E2}$ tune out parasitic capacitances presented at the RF input, the (single-ended) input impedance of the proposed common-base circuit can be approximated as $$Z_{in} = (R_E + 1/g_{m1})\frac{2A}{(2A+1)} \approx R_E + 1/g_{m1} \quad (16)$$

where it is assumed that the current mirror ratio (A) is 5 or larger and therefore 2 A>>1. In addition, since $I_{C1}=I_{C2}=AI_B$, $g_{m1}=g_{m2}=2Ag_{mB1}=2Ag_{mB2}$. As a result, for a given collector current $I_C$, both the conventional common-base transconductor and the common-base transconductor of FIG. 6 provide equal RF input transconductance for the down-conversion mixer.

If the $I_C$ of a bipolar transistor is modeled by Equation (13), it can be shown that the IIP3 of the proposed common-base circuit shown in FIG. 7(*b*) is given by $$v_{IIP3} = \frac{8}{\sqrt{3}}V_t(1+g_mR_E)^{3/2} \quad (17)$$

By comparing Equations (15) and (17) it is seen that the presented common-base circuit has by a factor of $\sqrt{3(1+g_mR_E)/(2g_mR_E-1)}$ a smaller IIP3 in comparison with the IIP3 of the traditional common-base stage.

Simulations of Common-Gate Transconductors

In the following, the characteristics of the conventional common-gate RF input transconductor of FIG. 3 and the common-gate RF input transconductor of FIG. 4 are simulated and compared in 0.35 μm BiCMOS technology, in which the supply voltage is 2.7 V. In the simulations, the current mirror ratio A of five is used. The results are presented as input power in dBm and the differential RF input voltage referred to is 100Ω impedance. The simulations are performed at 900 MHz.

The common-mode IIP2 s, i.e. measured at the single-ended transconductor output, of the conventional and the novel common-gate RF input transconductors are plotted in FIG. 7 as a function of the input device ($M_1$ and $M_2$) drain-source current $I_{DS}$. Corresponding to each value of $I_{DS}$, the aspect ratios (AW/L) of common-gate FET's $M_1$ are selected to guarantee the input impedance matching, i.e. $Z_{in}=R_s=50\Omega$ □ $1/g_{m1}$.

From FIG. 7 it is seen that the common-gate transconductor of FIG. 4 exhibits very small second-order intermodulation distortion, whereas the common-mode IIP2 of the conventional common-gate transconductor of FIG. 3 is relatively poor in comparison with the transconductor according to the invention. In this particular example, the difference between the IIP2 s of the conventional and new common-gate circuits is larger than 50 dB.

Figure 8:
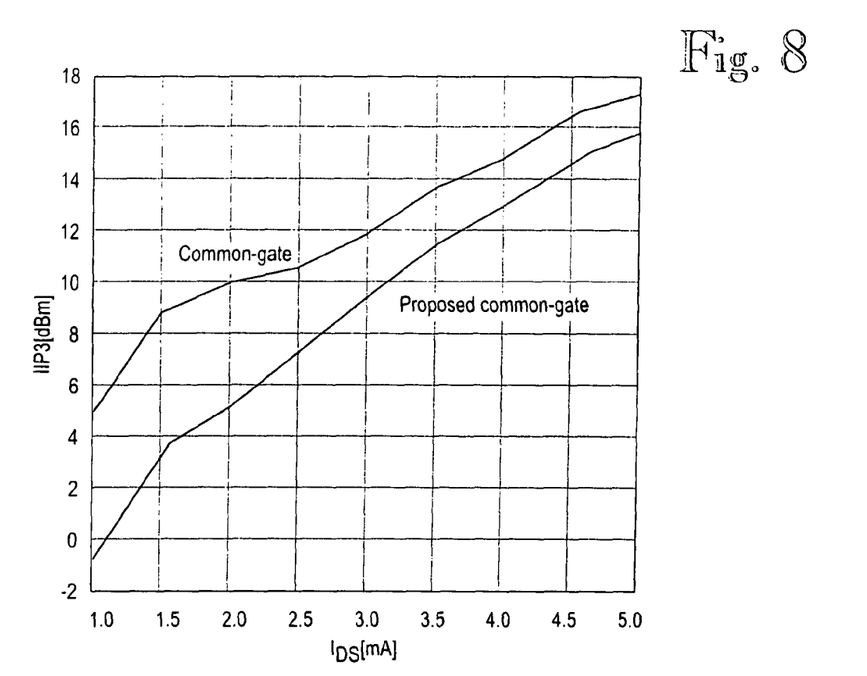
FIG. 8 is a graph illustrating the IIP3 of the conventional common-gate RF transconductor of FIG. 3 and the proposed common-gate RF transconductor of FIG. 4.

The IIP3 s of the conventional and the inventive common-gate RF input transconductors as a function of the input transistor IDS are plotted in FIG. 8. It can be seen that the conventional common-gate transconductor exhibits less third-order nonlinearity than the inventive circuit of FIG. 4. However, since the typical requirements for the down-conversion mixer IIP3 s are in the order of +5 ... +15 dBm, depending on the radio system and block partitioning, the IIP3 of the common-gate transconductor of FIG. 4 is also sufficient for most applications, assuming that the entire mixer IIP3 is dominated by the RF input stage third-order nonlinearity.

Figure 9:
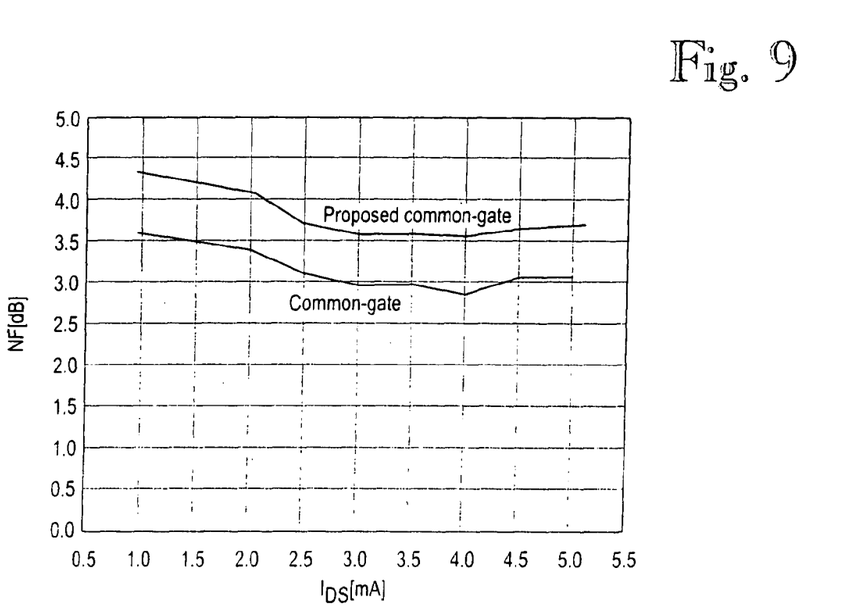
FIG. 9 is a graph illustrating the noise figures (NF) of the conventional common-gate RF transconductor of FIG. 3 and the proposed common-gate RF transconductor of FIG. 4.

The noise figures (NF) of the common-gate and proposed common-gate RF input transconductors are plotted in FIG. 9 as a function of the input device ($M_1$ and $M_2$) drain-source current $I_{DS}$. Corresponding to each value of $I_{DS}$, the aspect ratios (AW/L) of common-gate FETs $M_1$ are selected to guarantee the input impedance matching, i.e. $Z_{in}=R_s=50\Omega$ □ $1/g_{m1}$. It is seen that with practical values of $I_{DS}$ the proposed circuit has an NF that is only about 0.6 dB larger than the conventional common-gate circuit. Moreover, in an actual mixer, the noise due to the switching transistors and load resistors are added to the transconductor noise. Thus, in a practical mixer, the difference between the NFs of the mixers employing the proposed and conventional common-gate circuits is even smaller than 0.6 dB. Moreover, if the NF of the entire receiver is considered, it should be noticed that the NF of the mixer is suppressed by the gain in the LNA. It is concluded that the inventive common-gate circuit has a similar effect to the receiver NF as the conventional common-gate transconductor.

Simulations of Common-Base Transconductors

In the following, the characteristics of the traditional common-base RF input transconductor of FIG. 5 and common-base RF input transconductor of FIG. 6 are simulated and compared in 0.35 μm BiCMOS technology, in which the supply voltage is 2.7 V. In the simulations, the current mirror ratio A of five is used. All the results are presented as input power in dBm and the differential RF input voltage is referred to 100Ω impedance. The simulations are performed at 900 MHz. Corresponding to each value of $I_C$, the value of the emitter degeneration resistance $R_E$ is selected to guarantee the input impedance matching, i.e. $Z_{in}=R_s=50\Omega$ □ ($R_E+1/g_{m1}$).

Figure 10:
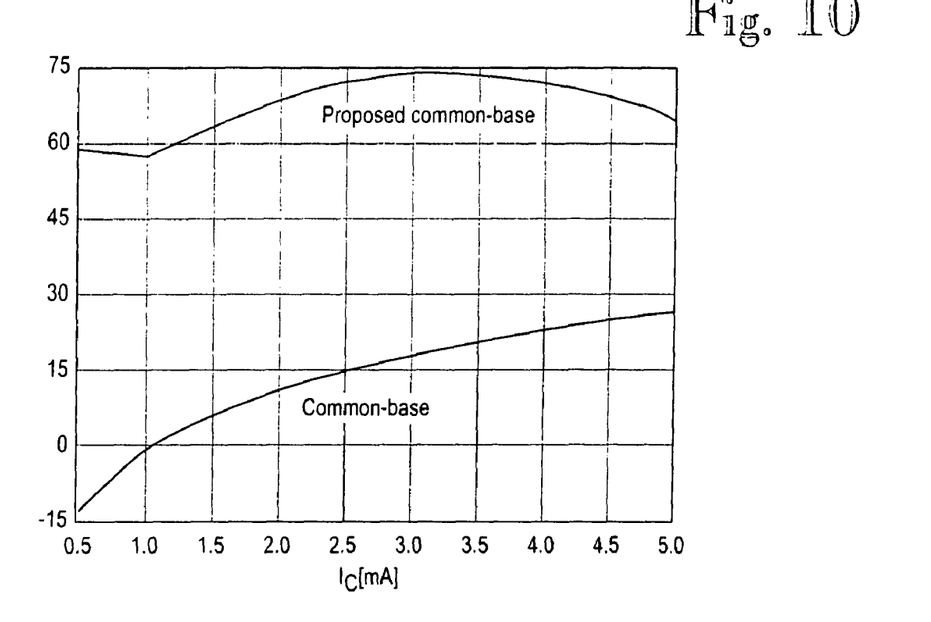
FIG. 10 is a graph illustrating the common-mode IIP2 of the conventional common-base RF transconductor of FIG. 5 and the proposed common-base RF transconductor of FIG. 6.

FIG. 10 illustrates the single-ended IIP2 s of the conventional common-base and the inventive common-base RF input transconductors as a function of input device collector current $I_C$. Similarly as with the MOS embodiment above, it is seen that the inventive common-base transconductor exhibits very small second-order intermodulation distortion, whereas the single-ended IIP2 of the conventional common-base transconductor is over 35 dB worse than the IIP2 of the inventive transconductor.

Figure 11:
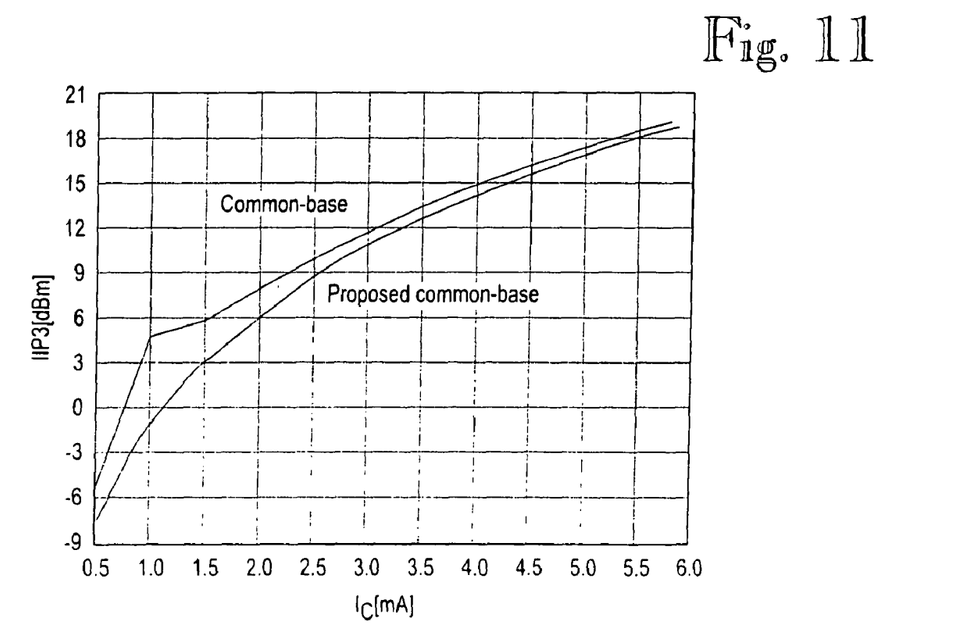
FIG. 11 is a graph illustrating the IIP3 of the conventional common-base RF transconductor of FIG. 5 and the proposed common-base RF transconductor of FIG. 6.

The IIP3 s of the conventional and proposed common-base RF input transconductors are plotted in FIG. 11 as a function of the collector current $I_C$ of the input transistor. It is seen that the conventional common-base transconductor has a slightly larger IIP3 than the inventive common-base transconductor. On the other hand, with large values of $I_C$ or $g_mR_E$, the transconductors have practically equal IIP3 s.

Figure 12:
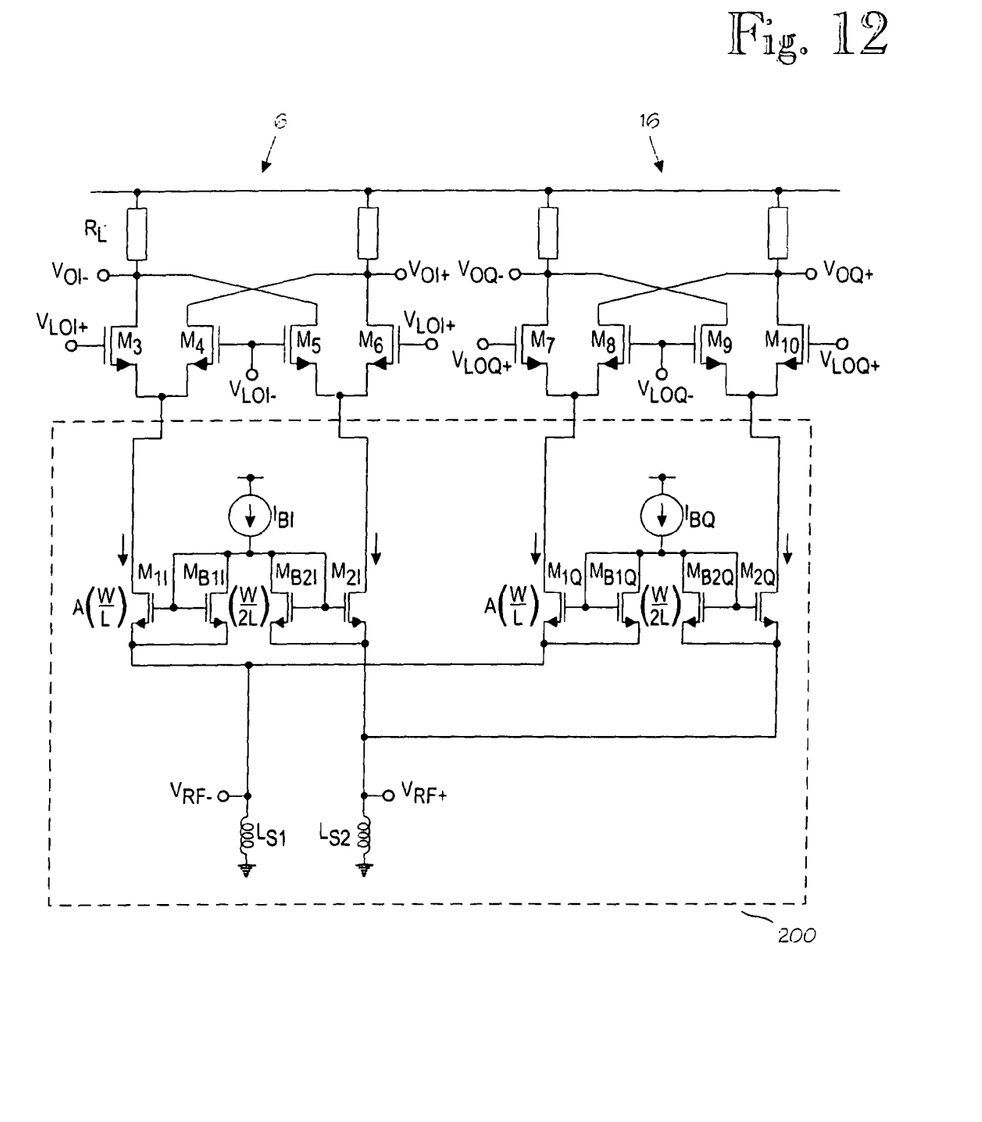
FIG. 12 is a schematic diagram of an exemplary quadrature down-conversion mixer with separate RF input transconductors for the I and Q mixers, according to an embodiment of the invention.

Common-gate and common-base RF input transconductor stages according to different embodiments of the invention can be applied to various quadrature down conversion mixers, for example in the place of transconductor stage 20 in the quadrature down conversion mixer shown in FIG. 2 with a single common-gate RF input transconductor for both I and Q mixers. In quadrature down conversion mixers, for example similar to that shown in FIG. 2, a separate RF input transconductors may also be provided for the I and Q mixers 6 and 16, i.e. two transconductor stages may be connected in parallel. FIG. 12 shows a schematic diagram illustrating an example of such a quadrature down conversion mixer unit. In FIG. 2 and in FIG. 12, same reference symbols depict similar structures and functions. The common-gate RF transconductor 200 illustrated in FIG. 12 comprises the main field effect transistors (FETs) $M_{1I}$ and $M_{2I}$ in a common-gate configuration for the mixer 6 of the I branch. Similarly, the transconductor 200 comprises the main field effect transistors (FETs) $M_{1Q}$ and $M_{2Q}$ in a common-gate configuration for the mixer 16 of the Q branch. The transistors $M_{1I}$, $M_{2I}$, $M_{1Qi}$ and $M_{2Q}$ may be MOS FETs. The source electrode of $M_{1I}^i$ and $M_{1Q}$ is connected via a biasing inductor $L_{S1}$ to a reference potential, such as ground. Similarly, the source electrode of $M_{2I}$ and $M_{2Q}$ is connected via a biasing inductor $L_{S2}$ to the reference potential, such as ground. However, inductors LS1 and LS2 are not necessarily always required and they may be replaced, for instance, with current sources or resistors. Input terminals for differential RF input voltages $V_{RF-}$ and $V_{RF+}$ are provided at source electrodes of $M_{1I}$, $M_{1Q}$ and $M_{2I}$, $M_{2Q}$, respectively. Each pair of main transistors $M_{1i}$, $M_{2I}$, and $M_{1Qi}$, $M_{2Q}$ are biased by a respective current source $I_{BI}$ and $I_{BQ}$ as well as a respective pair of field effect transistors (FETs) $M_{B1I}$, $M_{B2I}$ and $M_{B1Q}$, $M_{B2Q}$. Transistors $M_{B1I}$, $M_{B2I}$ and $M_{B1Q}$, $M_{B2Q}$ may be MOSFETs, they are of equal size, and they may be half the size (W/2 L) of the single transistor (W/L) in the conventional stage shown in FIG. 3. The current source $I_{BI}$ is connected to the drain electrodes of $M_{B1I}$ and $M_{B2I}$. The gate electrode of $M_{B1I}$ is connected to the gate electrode of $M_{1I}$ and to the drain electrode of $M_{B1I}$. The gate electrode of $M_{B2I}$ is connected to the gate electrode of $M_{2I}$ and to the drain electrode of $M_{B2I}$. Moreover, the source electrode of $M_{B1I}$ is connected to the source electrode of $M_{1I}$, and the source electrode of $M_{B2I}$ is connected to the source electrode of $M_{2I}$. This way, the differential RF input signal is also applied to the biasing FETs $M_{B1I}$ and $M_{B2I}$. Similarly, the current source $I_{BQ}$ is connected to the drain electrodes of $M_{B1Q}$ and $M_{B2Q}$. The gate electrode of $M_{B1Q}$ is connected to the gate electrode of $M_{1Q}$ and to the drain electrode of $M_{B1Q}$. Similarly, the gate electrode of $M_{B2Q}$ is connected to the gate electrode of $M_{2Q}$ and to the drain electrode of $M_{B2Q}$. Moreover, the source electrode of $M_{B1Q}$ is connected to the source electrode of $M_{1Q}$, and the source electrode of $M_{B2Q}$ is connected to the source electrode of $M_{2Q}$. This way, the differential RF input signal is also applied to the biasing FETs $M_{B1Q}$ and $M_{B2QI}$.

A quadrature down conversion mixer containing a common-gate and common-base RF input transconductor stages according to different embodiments of the invention may be applied especially to wireless direct conversion radio receiver architectures for full-duplex radio systems, in which an interstage RF filter is provided between a low-noise amplifier (LNA) and a quadrature down conversion mixer stage. The down converting mixer stage and the low-noise amplifier LNA may be implemented in a radio frequency (RF) integrated circuit chip using any suitable integrated circuit manufacturing technology, including bipolar, CMOS, and BiCMOS technologies. The interstage RF filter may be an off-chip RF filter. The interstage RF filter may be realized in surface acoustic (SAW) technology.

It will be obvious to a person skilled in the art that, as the technology advances, the inventive concept can be implemented in various ways. The invention and its embodiments are not limited to the examples described above but may vary within the scope of the claims.

The invention claimed is:

1. A transconductor circuit, comprising:
   a first input transistor device;
   a second input transistor device, wherein each of the first and second input transistor devices are configured in a common-gate configuration with interconnected gate electrodes and has a source electrode coupled to a differential radio frequency input signal;
   a first biasing transistor device having a gate electrode coupled to a gate electrode of the first input transistor device; and
   a second equally-sized biasing transistor device having a gate electrode coupled to a gate electrode of the second input transistor device to provide biasing for the first input transistor device and the second input transistor device, respectively, wherein
   the first and second biasing transistor devices each has a source electrode coupled to the source electrodes of the first input transistor device and the second input transistor device, respectively, to sense the differential radio frequency input signal.

2. The transconductor circuit as claimed in claim 1, wherein the first and second biasiang transistor devices each have a drain electrode connected to a source of a bias current.

3. The transconductor circuit as claimed in claim 1, wherein the first and second input transistor devices and the first and second biasing transistor devices are field effect transistors.

4. The transconductor circuit as claimed in claim 1, wherein said transconductor circuit is implemented on an integrated circuit chip.

5. A transconductor circuit, comprising:
   a first input transistor device;
   a second input transistor device, wherein each of the first and second input transistor devices configured in a common-base configuration with interconnected base electrodes and has an emitter electrode coupled to a differential radio frequency input signal;
   a first biasing transistor device having a base electrode coupled to a base electrode of the first input transistor device;
   a second equally-sized biasing transistor device having a base electrode coupled to a base electrode of the second input transistor device; and
   a third biasing transistor device having a base electrode coupled to collector electrodes of the first and second bias transistor devices and an emitter electrode coupled to the base electrodes of the first input transistor device and the second input transistor device, wherein the first and second biasing transistor devices each has an emitter electrode operationally coupled to the emitter electrodes of the first input transistor device and the second input transistor device, respectively, to sense the differential radio frequency input signal.

6. The transconductor circuit as claimed in claim 5, wherein the collector electrodes of the first and second biasing transistor devices are coupled to a source of a bias current.

7. The transconductor circuit as claimed in claim 6, wherein the emitter electrodes of the first and second transistor devices are coupled to the differential radio frequency input signal via respective first and second emitter resistances, and the emitter electrodes of the first and second biasing transistor devices are coupled to the differential radio frequency (RF) input signal via respective third and fourth emitter resistances, the third and fourth emitter resistances having a value which is 2 A times a value of the first and second emitter resistances, wherein A=current mirror ratio.

8. The transconductor circuit as claimed in claim 5, wherein the transistor devices are bipolar transistors.

9. The transconductor circuit as claimed in claim 5, wherein said transconductor circuit is implemented on an integrated circuit chip.

* * * * *